United States Patent [19]  
Lesh, deceased et al.

[11] 4,054,484  
[45] Oct. 18, 1977

[54] METHOD OF FORMING CROSSOVER CONNECTIONS

[75] Inventors: Nathan George Lesh, deceased, late of Bethlehem, Pa.; by William B. Ketterer, executor, Allentown, Pa.; Joseph Michael Morabito, Bethlehem, Pa.; John Henry Thomas, III, Pickerington, Ohio

[73] Assignee: Bell Telephone Laboratories, Incorporated, Murray Hill, N.J.

[21] Appl. No.: 625,025

[22] Filed: Oct. 23, 1975

[51] Int. Cl.$^2$ ............................................. H01L 21/90
[52] U.S. Cl. ................................. 156/652; 156/656; 156/666; 357/71; 427/89; 427/91; 427/92
[58] Field of Search .................... 156/3, 7, 8, 13, 18, 156/652, 656, 664, 666, DIG. 901; 427/89, 91, 92; 174/68.5; 29/578; 357/71; 361/410

[56] References Cited

U.S. PATENT DOCUMENTS

| 3,702,273 | 11/1972 | Johnston et al. ...................... 156/18 |
| 3,769,108 | 10/1973 | Feldman et al. ....................... 156/3 |
| 3,890,177 | 6/1975 | Pfahnl et al. .......................... 156/13 |

FOREIGN PATENT DOCUMENTS 2,108,730  2/1971  Germany ........................... 174/68.5

Primary Examiner—Charles E. Van Horn  
Assistant Examiner—Jerome W. Massie  
Attorney, Agent, or Firm—Lester H. Birnbaum

[57] ABSTRACT

Disclosed is a crossover fabrication technique which is compatible with interconnect metallization for thin film and hybrid circuits which comprises a layer of copper. In one embodiment, evaporated layers of Ti and Cu are used as the base layers to build up the crossover spacing layer. A nickel protective layer is formed over the evaporated layers and the interconnect metallization. A copper spacing layer is then formed over the nickel layer by plating. Pillar holes are etched over selected areas of the interconnect metal preferably using an etchant which removes both the copper spacing layer and nickel protective layer, followed by forming the gold crossovers. The remaining copper spacing layer is removed by an etchant which preferentially attacks copper, and the nickel protective layer and copper base layers are preferably removed by a single etchant.

11 Claims, 8 Drawing Figures

METHOD OF FORMING CROSSOVER CONNECTIONS

BACKGROUND OF THE INVENTION

This invention relates to the fabrication of thin film and hybrid integrated circuits, and in particular to the formation of crossover connections on said circuits.

Thin film and hybrid circuits presently enjoy extensive use in a wide variety of applications, such as filter circuits and memories switching and transmission systems. This extensive use has recently prompted the development of a new interconnect multilayer metallization system for such circuits comprising layers of titanium-copper-nickel-gold with an optional layer of palladium between the titanium and copper layers. See U.S. patent application of Lesh, Morabito and Thomas, Ser. No. 576,711 filed May 12, 1975, which is incorporated by reference herein. The basic advantage of such a system is the requirement of only a minimum amount of gold, resulting in great cost savings over the prior art systems.

One of the problems associated with this new system, however, was that a new fabrication technique was needed for forming "crossover" connections necessary for electrically connecting certain metallization across any intervening elements or metallization in the circuit. In particular it was desirable to utilize at least a portion of said interconnect metallization as a base layer for forming the copper spacing layer commonly utilized for crossover fabrication. This created additional problems in that the removal of the spacing layer would undercut the copper layer of the interconnect metallization.

It is therefore a primary object of the invention to provide a crossover fabrication technique which is fast, simple and economical and which is compatible with the constraints imposed by interconnect metallization systems which utilize layers of copper.

SUMMARY OF THE INVENTION

This and other objects are achieved in accordance with the invention. In one embodiment directed to use with Ti-Cu-Ni-Au, the evaporated layers of Ti and Cu formed during interconnect fabrication are utilized as the base layers for the copper spacing layer. In the crossover processing, a thin nickel layer is first plated over the evaporated Ti-Cu and completed interconnect metal. Without allowing the circuit to dry, the copper spacing layer is plated over the nickel layer. Pillar holes are formed over selected areas of the interconnect metallization preferably by means of an etchant which removes both the copper and nickel layers in these areas. The crossover connection is then formed over the spacing layer between these selected metallizations making contact through the pillar holes. The spacing layer is removed by a selective copper etchant, while the copper layer of the interconnect metal is protected by the nickel layer. The nickel layer and evaporated copper are then advantageously removed by a single etchant, followed by removal of titanium.

BRIEF DESCRIPTION OF THE DRAWING

These and other features of the invention will be delineated in detail in the description to follow. In the drawing.

It will be appreciated that these drawings are not made to scale.

DETAILED DESCRIPTION OF THE INVENTION

The method in accordance with one embodiment of the invention is described with reference to FIGS. 1A - 1H which illustrate various steps in the fabrication of a single crossover on a portion of a typical thin film or hybrid integrated circuit. It will be realized that several such crossovers may be batch processed on a single circuit and further that an actual circuit would typically include many more interconnect elements as well as various circuit elements such as resistors, capacitors and integrated circuit chips.

Figure 1A:
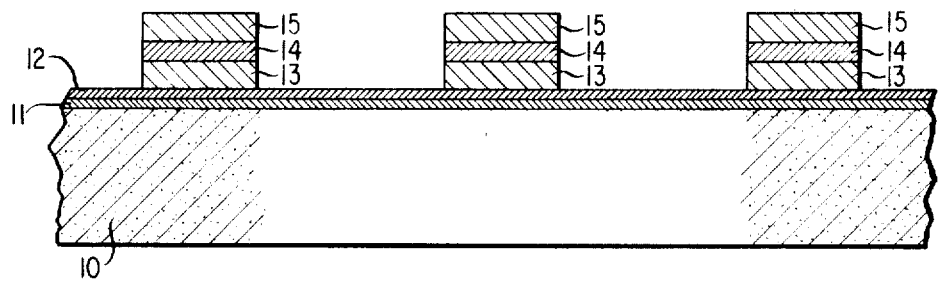
FIGS. 1A - 1H are cross-sectional views of a portion of a circuit illustrating various processing steps in accordance with one embodiment of the invention.

FIG. 1A illustrates a portion of a typical circuit after formation of the interconnect metallization. The insulating substrate, 10, typically comprises a ceramic material. Formed over essentially the entire surface of the substrate were successive layers of titanium, 11, and copper, 12, by standard evaporation techniques. Additional copper layer, 13, was then selectively plated over the areas which were to form the interconnect pattern. (Layer 13 is shown as distinct from layer 12 for purposes of illustration.) This was followed by plating a layer of nickel, 14, on the plated copper layer, and plating a layer, 15, of gold on the nickel layer to complete the interconnect metallization scheme. (The process for forming such metallization is described in more detail in U.S. patent application of Lesh, Morabito and Thomas, Ser. No. 576,711, filed May 12, 1975 which has been incorporated by reference herein.)

Figure 1B:
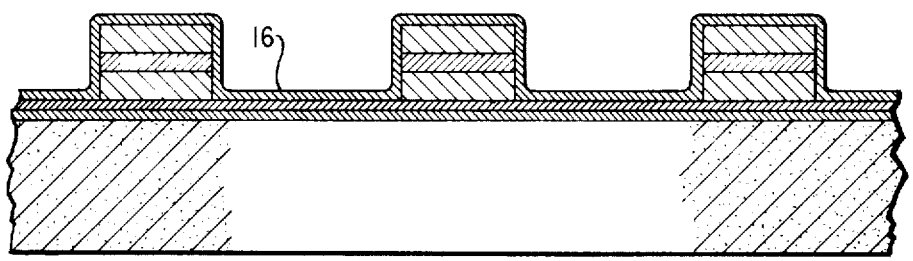

In the fabrication of the crossover connection, the evaporated copper layer, 12, utilized for forming the interconnect metallization, was also used as the base layer to build up the spacing layer to be described. Since this evaporated copper layer, as well as the plated copper layer, 13, was also part of the interconnect metal, it was desirable to protect the copper layer from subsequent etching operations. Therefore, as illustrated in FIG. 1B, a thin layer, 16, of nickel was plated over the evaporated copper layer and interconnect metal pattern. Preferably, the nickel layer is formed over essentially the entire circuit, although the layer can be selectively formed over the necessary portions of the circuit if desired. Plating was performed in a bath comprising nickel sulfamate. The particular bath used was that sold by Allied-Kelite Co. under the trade name Barrett type SN which basically comprises nickel sulfamate and boric acid. Other commercially available nickel plating baths may be utilized. It was found that a minimum nickel thickness of approximately 6,000 A was desirable to insure edge coverage and provide adequate protection of the copper in the interconnect metal. Although electro-plating is the preferred method of forming the nickel layer, other methods such as evaporation might be employed.

Figure 1C:
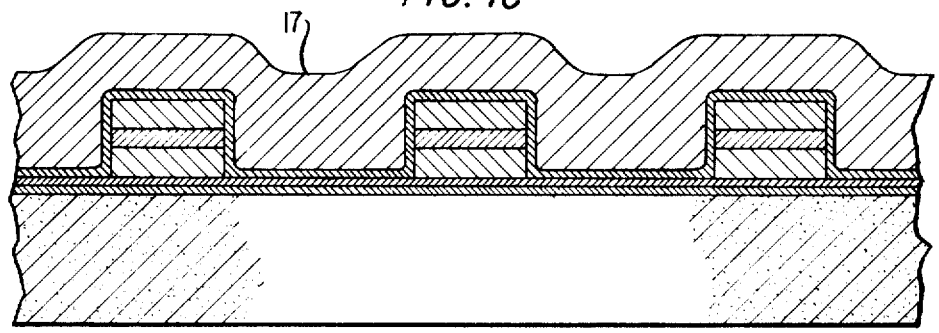

In the next step, as illustrated in FIG. 1C, a spacing layer 17, comprising copper was plated over the same area as the nickel layer. The plating operation is preferably performed in a high concentration $CuSO_4$ plating bath. An optimum solution was found to comprise approximately 68 gms/liter of $CuSO_4$ and 180 gms/liter $H_2SO_4$, although these proportions can be adjusted and other copper plating baths may be utilized. The spacing layer was formed to a thickness of approximately 30 microns, although a range of thickness of approximately 1-2 mils would be appropriate. Advantageously, the copper plating is performed before the circuit dries from the previous nickel plating operation. This is done to prevent possible poor adhesion between the copper and nickel layers resulting from the formation of nickel oxide after prolonged exposure of the nickel layer to the atmosphere.

Figure 1D:
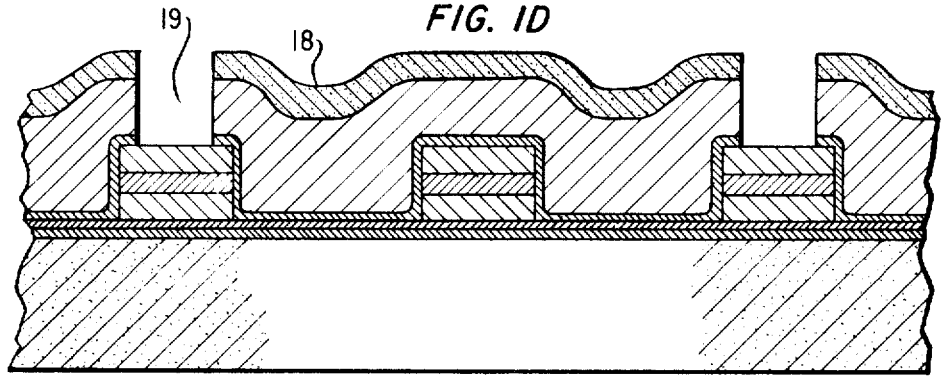

At this stage, the crossover patterning is performed. As illustrated in FIG. 1D, pillar holes, 19, are etched through the copper spacing layer, 17, and nickel protective layer, 16, above selected areas of the interconnect metallization to be contacted by the crossover connection. The selected areas are defined by standard photolithographic operations which basically comprise forming a layer of photoresist, 18, over the copper spacing layer, exposing the photoresist to light through an appropriate mask and developing so that the areas of photoresist exposed to light are dissolved. The exposed areas of the copper spacing layer and underlying nickel layer are then advantageously removed by a single etchant. The particular etchant used was a spray etch comprising $FeCl_3$. The etching operation was performed for a sufficient length of time to completely remove both layers in these areas so that the gold layer of the interconnect metallization was exposed as shown.

Figure 1E:
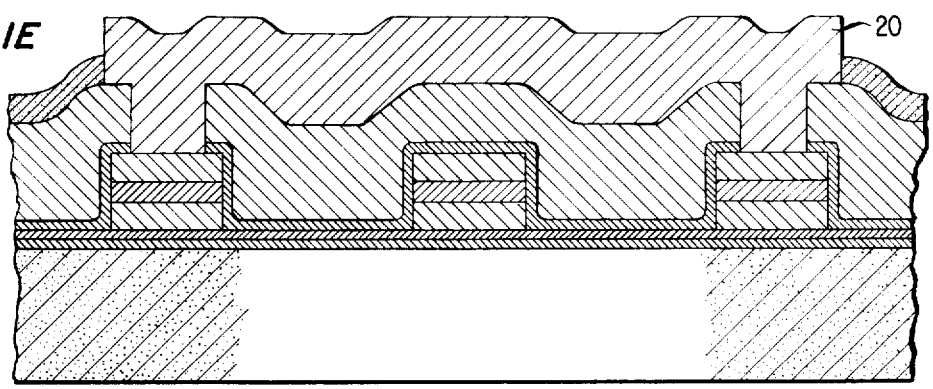

The pattern of the actual beam crossover is defined by means of re-exposing the photoresist layer 18 and developing to form the pattern as shown in FIG. 1E again utilizing standard photolithographic techniques. An appropriate conducting metal, in this case gold, is then formed over the areas of the pillar holes and spacing layer which are not covered by the photoresist layer so as to form a crossover connection 20 between two interconnect patterns over an intervening interconnect pattern as also shown in FIG. 1E. In this example, the gold layer 20 was electro-plated onto the structure utilizing a standard gold cyanide plating bath comprising potassium gold cyanide, ammonium citrate and ammonium sulfate. Of course, other gold plating baths may be used. The thickness of the gold layer was approximately 30 microns, but a thickness in the range 1-2 mils appears appropriate.

Figure 1F:
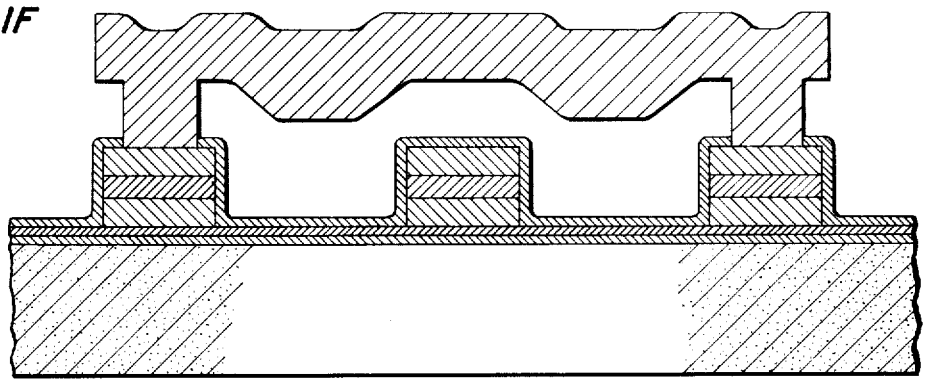

After removal of the photoresist layer, 18, the copper spacing layer, 17, was removed by an etchant which does not significantly affect the nickel layer, 16, resulting in the structure shown in FIG. 1F. In this particular example, the etchant comprised approximately 100 gms/liter of trichloroacetic acid in a solution of 1:1 $NH_4OH$, which etched the copper at a rate of approximately 300 A/sec. Again, other solutions may be found which perform the same function. For example, ammonium persulfate was also utilized and was found to be preferable. Any cuprous crystals which form on the nickel layer can be removed by a separate rinse in 1:1 $NH_4OH$. It will be realized that during the etching of the copper spacing layer, the copper layer 13 which is part of the interconnect metal is protected by the nickel layer 16.

Figure 1G:
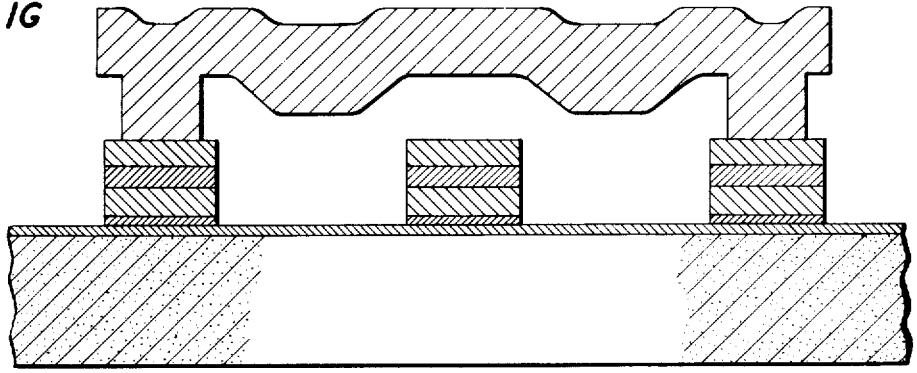

After removal of the spacing layer, the nickel protective layer 16 and evaporated copper film 12 are advantageously removed by a single etchant. This was accomplished by again utilizing the standard spray etch comprising $FeCl_3$. The resulting structure is shown in FIG. 1G. Since these layers are thin (approximately 1,500 A), the etching may be done rapidly (approximately 10 sec) so that no significant undercutting of the copper layer 13 is effected.

Figure 1H:
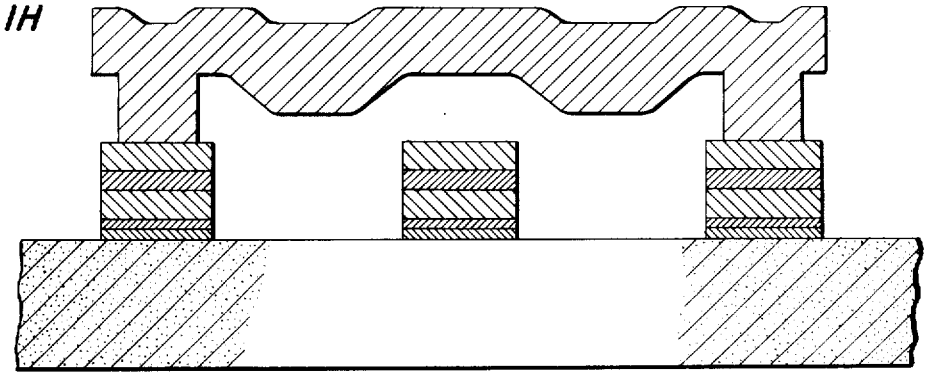

Finally, the titanium layer, 11, is removed advantageously in a 20:1 solution of hydrofluoric acid to complete the definition of the interconnect pattern resulting in the structure shown in FIG. 1H. Any sludge remaining on the structure can then be removed by a quick dip (approximately 5 sec) in ammonium persulfate.

It should be realized that one of the main advantages of the present process over that normally used for the Ti-Pd-Au interconnect system is the significant reduction in processing time. In particular, since the base copper layer already exists in the Ti-Cu-Ni-Au interconnect metallization, only two plating operations are needed.

Several hybrid integrated circuits were fabricated utilizing the crossover processing in accordance with the invention. No significant undercutting of the copper layer in the Ti-Cu-Ni-Au metallization was observed. Furthermore, no crossover connections were found to be faulty. Bilevel circuits (i.e., those with metallization on both major surfaces of the insulating substrate) were also fabricated and the crossover process found similarly compatible with circuit production.

It will be appreciated that although the present process has been described in particular with reference to a Ti-Cu-Ni-Au interconnection system, it will be generally applicable to a circuit utilizing any interconnect system which includes copper as one of the layers.

Various additional modifications will become apparent to those skilled in the art. All such variations which basically rely on the teachings through which the invention has advanced the art are properly considered within the spirit and scope of the invention.

What is claimed is:

1. A method of forming a conductive crossover connection between at least two conductors formed on an insulating substrate over an area separating said conductors comprising the steps of:
    forming over said substrate a first copper layer;
    forming on selected areas of said layer at least two conductors including a second layer of copper;
    forming a layer of nickel over said first copper layer and said conductors;
    plating over said nickel layer a third copper layer;
    removing selected areas of said third copper layer and said nickel layer over at least two of said conductors so as to expose said conductors in said areas,
    forming over the conductors in said selected areas and over the remaining third copper layer in the space between conductors a conductive metal so as to form a conductive connection between said conductors;
    removing said third copper layer with an etchant which does not significantly etch the nickel layer such that the first and second copper layers in the conductors are protected from the etchant;
    removing said nickel layer; and
    removing the areas of said first copper layer not covered by said conductors.

2. The method according to claim 1 further comprising the step of, prior to forming said first copper layer, forming a layer of titanium over said substrate.

3. The method according to claim 2 wherein said titanium and first copper layers are formed by evaporation.

4. The method according to claim 1 wherein the layer of nickel is formed by plating to a thickness of at least 6,000 A.

5. The method according to claim 1 wherein said third copper layer is plated to a thickness in the range 1-2 mils.

6. The method according to claim 4 wherein the third copper layer is plated over said nickel layer before said nickel layer is dry.

7. The method according to claim 1 wherein the third copper layer and nickel layer are removed in said selected areas by a single etchant.

8. The method according to claim 1 wherein the conductive metal comprises gold.

9. The method according to claim 1 wherein the etchant for removing the third copper layer comprises ammonium persulfate.

10. The method according to claim 1 wherein said nickel layer and said first copper layer are removed by a single etchant.

11. A method of forming a conductive crossover connection between at least two conductors formed on an insulating substrate over an area separating said conductors, comprising the steps of:

forming a layer of titanium over said substrate;
forming a first copper layer over said titanium layer;
forming on selected areas of said first copper layer at least two conductors comprising successively a second layer of copper, a first layer of nickel and a layer of gold;
plating a second layer of nickel over said first copper layer and said conductors to a thickness of at least 6,000 A;
plating a third copper layer over said second nickel layer to a thickness in the range 1-2 mils before said nickel layer dries;
removing by a single etchant selected areas of said third copper layer and said second nickel layer over said conductors to be connected so as to expose said conductors in said areas;
plating over the conductors in said selected areas and over the remaining third copper layer in the space between conductors a conductive metal comprising gold to a thickness in the range 1-2 mils so as to form a conductive connection between said conductors;
removing said third copper layer with an etchant which does not significantly etch the said second nickel layer such that the first and second copper layers in the conductors are protected from the etchant;
removing said second nickel layer and the area of said first copper layer not covered by said conductors with a single etchant; and
removing said layer of titanium.

* * * * *